(12) United States Patent
Mikami

(10) Patent No.: US 11,316,279 B2
(45) Date of Patent: Apr. 26, 2022

(54) RADIO WAVE ABSORBER AND MANUFACTURING METHOD OF RADIO WAVE ABSORBER

(71) Applicant: FUJIFILM Corporation, Tokyo (JP)

(72) Inventor: Tatsuo Mikami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/578,527

(22) Filed: Sep. 23, 2019

(65) Prior Publication Data

US 2020/0169000 A1    May 28, 2020

Related U.S. Application Data

(63) Continuation of application No. PCT/JP2018/011524, filed on Mar. 22, 2018.

(30) Foreign Application Priority Data

Mar. 29, 2017  (JP) .............................. JP2017-065330

(51) Int. Cl.
*H01Q 17/00*  (2006.01)
*H05K 9/00*  (2006.01)

(52) U.S. Cl.
CPC ........... *H01Q 17/00* (2013.01); *H05K 9/0083* (2013.01); *B32B 2255/02* (2013.01)

(58) Field of Classification Search
CPC ...... H01Q 17/00; H05K 9/009; H05K 9/0088; H05K 9/0081; H05K 9/0083; H05K 9/00; B32B 15/08; B32B 2255/02
USPC ......................................................... 343/907
See application file for complete search history.

(56) References Cited

U.S. PATENT DOCUMENTS

| | | | | |
|---|---|---|---|---|
| 2001/0032701 A1* | 10/2001 | Kawanaka | ............. | H01Q 17/00 156/276 |
| 2006/0093782 A1 | 5/2006 | Sano et al. | | |
| 2008/0180308 A1* | 7/2008 | Okada | .................. | H05K 9/0083 342/1 |
| 2008/0257599 A1* | 10/2008 | Matsushita | .......... | H01Q 17/007 174/390 |
| 2010/0052992 A1* | 3/2010 | Okamura | ............. | H01Q 19/108 343/700 MS |

(Continued)

FOREIGN PATENT DOCUMENTS

| | | |
|---|---|---|
| JP | 2-116199 A | 4/1990 |
| JP | 6-235281 A | 8/1994 |

(Continued)

OTHER PUBLICATIONS

Notice of Reasons for Refusal dated Mar. 3, 2020 from the Japanese Patent Office in Application No. 2019-509682.

(Continued)

*Primary Examiner* — Hai V Tran
(74) *Attorney, Agent, or Firm* — Sughrue Mion, PLLC

(57) ABSTRACT

A radio wave absorber including: a support; and a linear absorber that is disposed on at least one surface of the support, has an occupancy per unit volume on the support of 0.05 to 0.70, includes a radio wave absorption material and a binder, and has a maximum length on a cross section perpendicular to a longitudinal direction of 25% or less of a wavelength of the radio wave, and a manufacturing method thereof.

6 Claims, 3 Drawing Sheets

(56) References Cited

U.S. PATENT DOCUMENTS

| | | | | |
|---|---|---|---|---|
| 2010/0188833 A1* | 7/2010 | Liang | ................. | H01B 1/04 |
| | | | | 361/818 |
| 2011/0008580 A1* | 1/2011 | Kagawa | ................. | B32B 27/32 |
| | | | | 428/167 |
| 2013/0285846 A1* | 10/2013 | Kagawa | ................. | H05K 9/0086 |
| | | | | 342/1 |
| 2015/0027771 A1* | 1/2015 | Kagawa | ................. | B32B 27/20 |
| | | | | 174/350 |
| 2015/0303583 A1* | 10/2015 | Takahashi | ................. | H01Q 17/008 |
| | | | | 342/1 |
| 2015/0342099 A1* | 11/2015 | Jang | ................. | H01Q 17/00 |
| | | | | 174/350 |
| 2015/0364824 A1 | 12/2015 | Song et al. | | |
| 2019/0269048 A1* | 8/2019 | Fujita | ................. | B32B 7/023 |
| 2019/0312356 A1* | 10/2019 | Fujita | ................. | H01F 1/375 |

FOREIGN PATENT DOCUMENTS

| | | |
|---|---|---|
| JP | 2000-277973 A | 10/2000 |
| JP | 2006-128373 A | 5/2006 |
| JP | 2006-140298 A | 6/2006 |
| JP | 2006-203147 A | 8/2006 |
| JP | 2007-016590 A | 1/2007 |
| JP | 2007-112702 A | 5/2007 |
| JP | 2011-076794 A | 4/2011 |
| JP | 2011-103180 A | 5/2011 |

OTHER PUBLICATIONS

Extended European Search Report dated Mar. 4, 2020 from the European Patent Office in Application No. 18774586.4.
International Search Report dated Jun. 12, 2018 from the International Searching Authority in counterpart International Application No. PCT/JP2018/011524.
International Preliminary Report on Patentability dated Oct. 1, 2019 from the International Bureau in counterpart International Application No. PCT/JP2018/011524.
Written Opinion dated Jun. 12, 2018 from the International Bureau in counterpart International Application No. PCT/JP2018/011524.
Office Action dated Sep. 22, 2021 in European Application No. 18774586.4.

* cited by examiner

RADIO WAVE ABSORBER AND MANUFACTURING METHOD OF RADIO WAVE ABSORBER

CROSS-REFERENCE TO RELATED APPLICATIONS

This application is a continuation application of International Application No. PCT/JP2018/011524, filed Mar. 22, 2018, the disclosure of which is incorporated herein by reference in its entirety. Further, this application claims priority from Japanese Patent Application No. 2017-065330, filed Mar. 29, 2017, the disclosure of which is incorporated herein by reference in its entirety.

BACKGROUND OF THE INVENTION

1. Field of the Invention

The present disclosure relates to a radio wave absorber and a manufacturing method of a radio wave absorber.

2. Description of the Related Art

In general, in a device or equipment generating radio waves such as a communication apparatus or a radar (hereinafter, may be collectively referred to as electronic equipment), a method of preventing radiation noise leaking to outside, by disposing a radio wave absorption material which absorbs unnecessary electromagnetic waves which may cause a malfunction in the vicinity of the device or equipment, is often performed. More specifically, as the method of preventing radiation noise leaking to outside, a method of surrounding a device which is a noise generation source using a metal plate or a shielding material is known.

A radio wave absorber is used for preventing radiation noise of a radio wave radiated from electronic equipment from leaking to outside.

In general, a radio wave shielding material used for shielding radiation noise of a radio wave radiated from electronic equipment, for example, a metal plate or a shielding material including metal particles may cause a malfunction in the electronic equipment due to reflected electromagnetic wave due to irregular reflection of the radiation noise of radio wave on a surface.

Accordingly, for the prevention of leakage of noise radiated from electronic equipment, a method of using a radio wave absorber including a radio wave absorption material, instead of the radio wave shielding material is attempted.

For example, JP1994-235281A (JP-H06-235281A) discloses a radio wave absorber configured by three-dimensionally winding a linear radio wave absorption material.

JP1990-116199A (JP-H02-116199A) discloses a radio wave absorber which is integrated by providing a layer formed of a magnetic material on a conductor surface, and laminating a structure configured of a non-woven fabric obtained by mixing a conductive fiber and a fiber formed of a polymer resin on the layer described above.

JP2006-203147A discloses a radio wave absorber in which a conductor arrangement sheet formed by regularly arranging linear conductors or cruciform conductors on a surface of or in a dielectric sheet, and a conductor sheet having a surface resistance of 400Ω ($m^2 \cdot kg \cdot s^{-3} \cdot A^{-2}$) to 4000Ω ($m^2 \cdot kg \cdot s^{-3} \cdot A^{-2}$) are laminated on each other.

JP2007-016590A discloses a radio wave absorption non-woven fabric in which 0.1 g/liter or more and less than 2.0 g/liter of a carbon fiber bundle formed of a bundle of a plurality of single carbon fibers and having an average fiber length of 31 mm to 200 mm, an average fiber diameter of 5 µm to 25 µm, an average fiber bundle of 0.2 Tex to 200 Tex is included in a web, an inorganic fiber or an organic fiber is mixed to the spacing to form a linear fiber web, the carbon fiber bundles having different bundles are mixed and included in the non-woven fabric, and the non-woven fabric has wideband characteristics of radio wave absorption.

SUMMARY OF THE INVENTION

Meanwhile, for the radio wave absorbability of the radio wave absorber, it is necessary that an effect of an incidence angle of a radio wave is hardly received.

In regards to this point, in the radio wave absorber disclosed in JP1994-235281A (JP-H06-235281A), JP1990-116199A (JP-H02-116199A), JP2006-203147A and JP2007-016590A, the radio wave absorption material or the absorber including radio wave absorption material is three-dimensionally disposed, and it is assumed that a radio wave can be absorbed, even in a case where the radio wave is incident with a certain angle. However, the effect thereof is not sufficient and further improvement is desired.

An object of one embodiment of the invention is to provide a radio wave absorber hardly receiving an effect of an incidence angle of a radio wave and having excellent radio wave absorbability.

Another object of one embodiment of the invention is to provide a manufacturing method of a radio wave absorber capable of simply manufacturing the radio wave absorber described above.

Means for achieving the objects include the following aspects.

<1> A radio wave absorber comprising: a support; and a linear absorber that is disposed on at least one surface of the support, has an occupancy per unit volume on the support of 0.05 to 0.70, includes a radio wave absorption material and a binder, and has a maximum length on a cross section perpendicular to a longitudinal direction of 25% or less of a wavelength of the radio wave.

<2> The radio wave absorber according to <1>, in which the support and the absorber are disposed adjacent to each other, and the support includes a radio wave absorption material.

<3> The radio wave absorber according to <1>, further comprising: an absorption layer including a radio wave absorption material and a binder between the support and the absorber adjacent to the absorber.

<4> The radio wave absorber according to any one of <1> to <3>, in which the radio wave absorption material is a magnetic material.

<5> A manufacturing method of the radio wave absorber according to any one of <1> to <4>, the method comprising: a step of linearly ejecting an absorber formation composition including a radio wave absorption material, a binder, and a solvent onto the support from a nozzle.

According to one embodiment of the invention, a radio wave absorber hardly receiving an effect of an incidence angle of a radio wave and having excellent radio wave absorbability is provided.

According to another embodiment of the invention, a manufacturing method of a radio wave absorber capable of simply manufacturing the radio wave absorber is provided.

DESCRIPTION OF THE PREFERRED EMBODIMENTS

Figure 1:
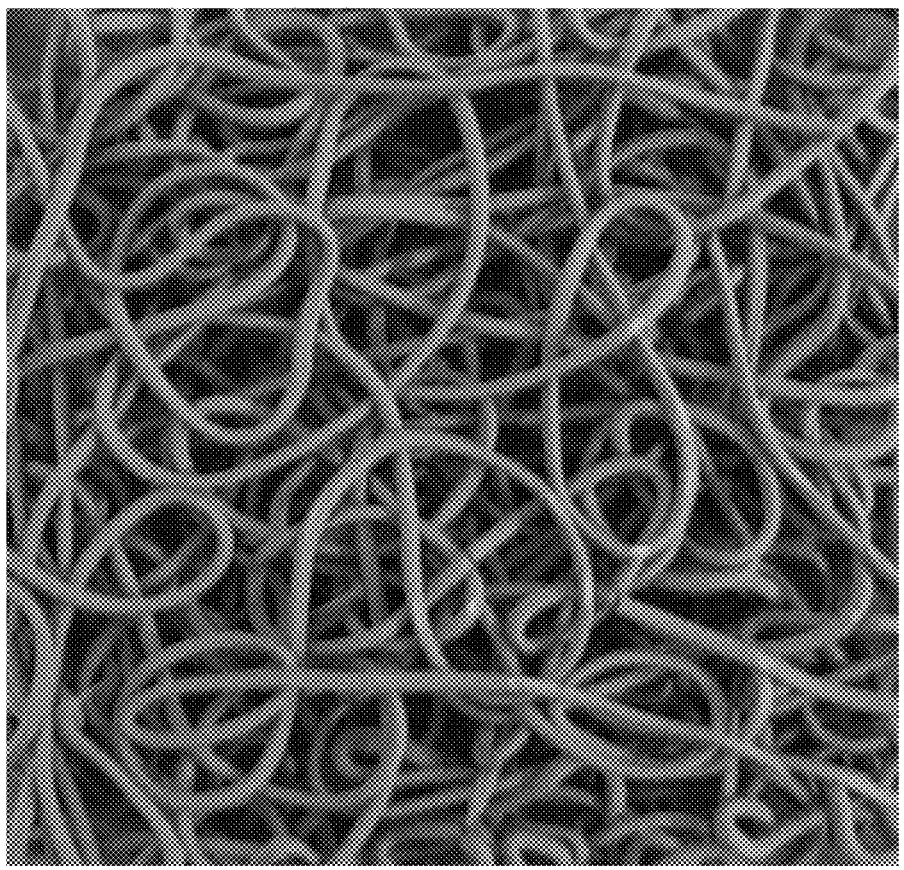
FIG. 1 is an optical image obtained by observing a radio wave absorber according to one embodiment of the invention in a normal direction of an absorber.

Hereinafter, a radio wave absorber and a manufacturing method of the same of the disclosure will be described. Here, the disclosure is not limited to the embodiments hereinafter, and modifications can be suitably added within the range of the object.

A range of numerical values shown using "to" in the disclosure means a range including numerical values before and after "to" as a minimum value and a maximum value.

In the range of numerical values disclosed in stepwise in the disclosure, an upper limit value and a lower limit value disclosed in a certain range of numerical values may be replaced with an upper limit value and a lower limit value disclosed in another range of numerical values disclosed in stepwise. In addition, in the range of numerical values disclosed in the disclosure, an upper limit value and a lower limit value disclosed in a certain range of numerical values may be replaced with values shown in examples.

In the specification, a combination of preferred aspects is a more preferred aspect.

In the disclosure, in a case where plural kinds of substances corresponding to each component are present, a content or a blending percentage of each component means a content or a blending percentage all of the plural kinds of substances, unless otherwise noted.

In the disclosure, an "acryl resin" means a resin including a structural unit derived from an acryl monomer having a (meth)acryloyl group. The "(meth)acryloyl group" has a concept including a methacryloyl group and an acryloyl group.

In the disclosure, a term "step" does not only mean an individual step, but also include a case a step cannot be clearly differentiated from another step, in a case where the desired object of the step is achieved.

[Radio Wave Absorber]

A radio wave absorber of the disclosure is a radio wave absorber including: a support; and a linear absorber that is disposed on at least one surface of the support, has an occupancy per unit volume on the support of 0.05 to 0.70, includes a radio wave absorption material and a binder, and has a maximum length on a cross section perpendicular to a longitudinal direction of 25% or less of a wavelength of the radio wave.

The radio wave absorber of the disclosure hardly receives an effect of an incidence angle of a radio wave and has excellent radio wave absorbability.

A reason for the radio wave absorber of the disclosure exhibiting such effect is not clear, but the inventors have surmised as follows.

It is thought that, in the radio wave absorber of the disclosure, by disposing a linear absorber having a maximum length on a cross section perpendicular to a longitudinal direction of 25% or less of a wavelength of the radio wave, on a support, a rebound due to a radio wave incident to the absorber and approached the absorber, that is, scattering of radio wave hardly occurs. In addition, in the radio wave absorber of the disclosure, by setting an occupancy of a linear absorber including a radio wave absorption material and a binder per unit volume on the support to be 0.05 to 0.70, the radio wave can be absorbed in an excellent manner, even in a case where the radio wave is incident at any angle. As a result of these, it is surmised that the radio wave absorber of the disclosure hardly receives an effect of an incidence angle of a radio wave and has excellent radio wave absorbability.

In the disclosure, the "radio wave absorbability" is evaluated by measuring a return loss (dB) at an incidence angle of 45° and a frequency of 48 GHz by a free space method.

A higher numerical value of the return loss means excellent radio wave absorbability and it is preferably equal to or greater than 20.0 dB.

The surmise described above does not limitedly interpret the effect of the invention and is described as an example.

As described above, as an example of evaluating the radio wave absorbability of the radio wave absorber, an example of evaluating the radio wave absorbability of the radio wave absorber by measuring a return loss in a case where a frequency of a radio wave absorbed by the radio wave absorber is approximately 48 GHz has been described. However, the evaluation standard is merely an example, and the evaluation method is not limited thereto.

By measuring a return loss in the same manner as described above by a free space method at a frequency suitable to a frequency of a radio wave radiated from electronic equipment which is an object for disposing the radio wave absorber, it is possible to evaluate more accurate radio wave absorbability suitable for the intended purpose of the radio wave absorber.

FIG. 1 is an optical image obtained by observing the radio wave absorber according to one embodiment of the invention in a normal direction of the radio wave absorber. As shown in FIG. 1, in the embodiment, linear absorbers are provided on the surface of the support. In FIG. 1, the linear absorbers are provided continuously with irregular gaps.

An occupancy of the linear absorber per unit volume on the surface of the support is 0.05 to 0.70, to exhibit excellent radio wave absorbability.

The occupancy of the linear absorber per unit volume on the support is more preferably 0.10 to 0.60 and even more preferably 0.20 to 0.50.

In a case where the occupancy of the linear absorber per unit volume on the support is in the range described above, the aspect of the linear absorber is not limited to the aspect shown in FIG. 1. For example, the linear absorber may be continuously or discontinuously formed. In addition, in the disposition aspect, the linear absorbers may be regularly provided with specific gaps or may be irregularly disposed. However, in a case where a disposition direction of the linear absorbers in a plan view is linearly parallel to one direction, for example, the reflection of the radio wave in a vertical direction may occur. Accordingly, as shown in FIG. 1, it is preferable that the linear absorbers are provided continuously with irregular gaps to be overlapped in a normal direction of the support.

Figure 2:
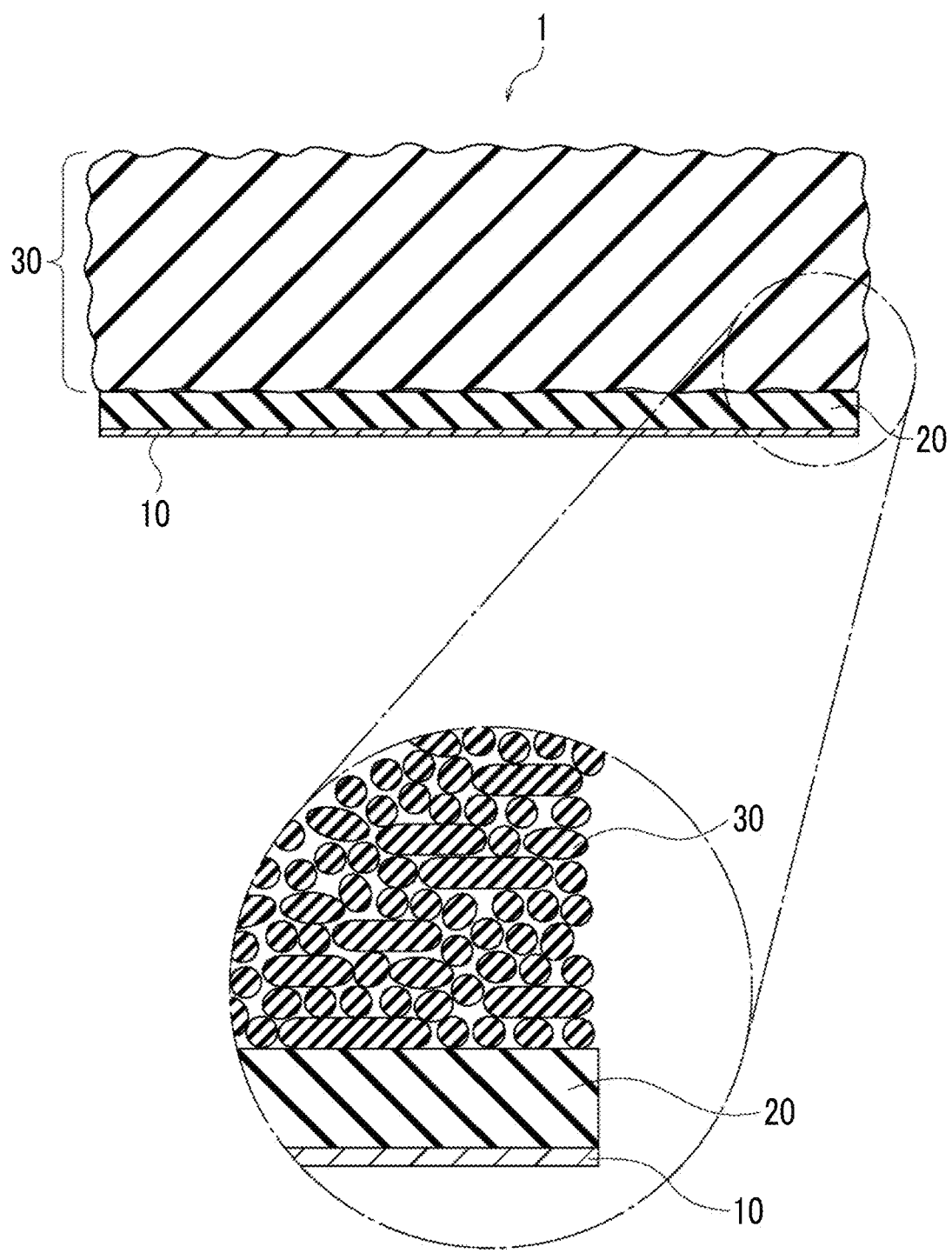
FIG. 2 is a schematic cross-sectional view and a partial edge view of the radio wave absorber according to the one embodiment of the invention.

FIG. 2 is a schematic cross-sectional view and a partial edge view of the radio wave absorber according to the one embodiment of the invention. In the embodiment shown in FIG. 2, the radio wave absorber 1 includes a support 10, an absorption layer 20 formed on one surface of the support, and a linear absorber 30 formed on the absorption layer 20. Regarding the aspect of the linear absorber 30, as shown in the partial edge view, a plurality of linear absorbers 30 having a maximum length on a cross section perpendicular to a longitudinal direction of 25% or less of a wavelength of the radio wave are laminated.

In the linear absorber, the maximum length on a cross section perpendicular to a longitudinal direction is 25% or less of a wavelength of the radio wave. Here, the wavelength of the radio wave is preferably a wavelength of the radio wave according to the characteristics of electronic equipment or the like in which the radio wave absorption material is used, from a viewpoint of further improving absorbability of the radio wave to be absorbed.

The maximum length of the linear absorber on the cross section of the linear absorber perpendicular to the longitudinal direction (hereinafter, simply referred to as a "cross section of the linear absorber") indicates a diameter thereof, in a case where the cross section of the linear absorber has a circular shape, and the maximum length thereof indicates a long diameter thereof, in a case where the cross section has an elliptical shape. In a case where the cross section of the linear absorber is a modified cross section or a cross section having an indeterminate shape, the maximum length means a maximum diameter of the cross section.

The maximum length on the cross section of the linear absorber corresponds to a width of the thickest portion of the linear absorber. Here, the maximum length on the cross section of the linear absorber is regulated, because the maximum length on the cross section of the linear absorber easily affects radio wave absorbability and reflection preventing properties of the radio wave.

The maximum length on the cross section of the linear absorber is 25% or less, preferably 20% or less, more preferably 10% or less of the wavelength of the radio wave. In addition, a lower limit of the maximum length on the cross section of the linear absorber is not limited, and is preferably equal to or greater than 2% of the wavelength of the radio wave, from a viewpoint of handleability and manufacturing suitability.

By providing a structure body in which structures having a size smaller than a wavelength of the radio wave to be absorbed are present at a cycle smaller than the wavelength of the radio wave, on the surface of the radio wave absorber, it is possible to prevent Fresnel reflection occurring the surface of the air and the absorber and reduce unnecessary reflection of the radio wave. In addition, by providing the structure body in which the structures having a size smaller than 50% of the wavelength of the radio wave are present at a cycle smaller than 50% of the wavelength of the radio wave, it is possible to prevent generation of higher-order diffracted light and reduce unnecessary reflection.

As the structure body disposed on the surface of the radio wave absorber is fine, the stronger effect is expected. According to the studies of the inventors, it is surmised that by setting the maximum length on the cross section of the linear absorber to be 25% or less of the wavelength of the radio wave and the occupancy to be 0.05 to 0.70, the structure body sufficiently smaller than the wavelength is formed on the surface of the radio wave absorber, and excellent effect of the disclosure is exhibited. The disclosure is not limited to the surmise mechanism.

In the specification, regarding the maximum length on the cross section perpendicular to the linear absorber, an optical image of the cross section of the radio wave absorber is captured, 10 portions of the cross section in a longitudinal direction of the linear absorber of the optical image are observed, a length on the cross section having the maximum length is measured, this operation is performed five times with different cross sections, and an average value of 50 measured results obtained is obtained and set as the maximum length of the linear absorber.

As shown in the partial edge view of FIG. 2, the linear absorbers are irregularly arranged. Regarding the cut cross section, not only the cross section perpendicular to the longitudinal direction, a cross section parallel to the longitudinal direction and a cross section in a diagonal direction to the longitudinal direction are also observed. Accordingly, in the optical image shown in FIG. 1, it is preferable that a size corresponding to the diameter of the linear absorber is determined in advance, and the cross section which is a measurement target in the optical image of the cross section of the radio wave absorber is determined with reference to the size.

The occupancy of the linear absorber per unit volume on the support can be measured by a method disclosed in examples which will be described later.

[Linear Absorber]

The radio wave absorber of the disclosure includes the linear absorber that is disposed on at least one surface of the support which will be described later, has an occupancy per unit volume on the support of 0.05 to 0.70, includes a radio wave absorption material and a binder, and has a maximum length on a cross section perpendicular to a longitudinal direction of 25% or less of a wavelength of the radio wave.

(Radio Wave Absorption Material)

The absorber includes a radio wave absorption material.

The radio wave absorption material is not particularly limited, as long as it can absorb the radio wave.

As an example of the radio wave absorption material, a magnetic material, a dielectric material, or a conductive material is used.

The magnetic material that can be used as the radio wave absorption material is not particularly limited. Examples of the magnetic material include powders of metal such as Fe, Co, and Ni, an alloy including these metals (so-called, magnetic alloy), compounds including these metals (oxide (so-called magnetic oxide), nitride (so-called magnetic nitride), carbide (so-called magnetic carbide) and the like).

Among these, as the magnetic material, magnetic oxide is preferable, and magnetic oxide having Fe as a main component is more preferable, from viewpoints of corrosion resistance and insulating properties. Here, the "main component" means a component, the content of which is 50 mass % or more in terms of a constituent percentage of the magnetic oxide.

Examples of the magnetic oxide having Fe as a main component include hexagonal ferrite (barium ferrite, strontium ferrite, or the like), magnetite, and γ-ferrite.

The magnetic material may include elements such as Al, Si, S, Sc, Ti, V, Cu, Y, Mo, Rh, Pd, Ag, Sn, Sb, Te, Ba, Ta, W, Re, Au, Bi, La, Ce, Pr, Nd, P, Zn, Sr, and B, in addition to the metal such as Fe, Co, and Ni.

Examples of the dielectric material that can be used as the radio wave absorption material include barium titanate powder, titanium oxide powder, and various resin fibers (polyethylene-based fiber).

Examples of the conductive material that can be used as the radio wave absorption material include conductive carbon powder, various metal powders (nickel, copper, tin powder, and the like), and various metal fibers (nickel, copper, tin fibers).

Among these, as the radio wave absorption material, the magnetic material is preferable, for example, from a viewpoint of ease of design of an absorption frequency.

By using the magnetic material as the radio wave absorption material, it is possible to prevent at least any of a composition, a particle shape, and a size of the magnetic material to design an absorption frequency of the radio wave absorber, and to efficiently increase the absorption of the radio wave at a desired frequency.

The absorber may include only one kind of radio wave absorption material or two or more kinds thereof.

A content of the wave radio absorption material in the absorber is not particularly limited, and is, for example, preferably equal to or greater than 5 mass %, more preferably equal to or greater than 20 mass %, and even more preferably equal to or greater than 50 mass % with respect to a total solid content of the absorber, from a viewpoint of ensuring excellent absorption characteristics.

The content of the radio wave absorption material in the absorber is not particularly limited, and is, for example, preferably equal to or smaller than 98 mass %, more preferably equal to or smaller than 95 mass %, and even more preferably equal to or smaller than 92 mass % with respect to a total solid content of the absorber, from viewpoints of manufacturing suitability and durability.

By adjusting the kind and content of the radio wave absorption material included in the linear absorber, it is possible to select a frequency band of the radio wave to be absorbed according to the purpose.

(Binder)

The absorber includes a binder.

In the specification, the "binder" of the absorber is a general term of a substance which is in a state where the radio wave absorption material is dispersed and can be formed in a linear state.

The binder is not particularly limited, as long as it can disperse the radio wave absorption material and can form an absorber in a linear state having a maximum length on a cross section perpendicular to the longitudinal direction of 25% or less of the wavelength of the radio wave.

As the binder, synthesis rubbers such as an acryl rubber obtained by copolymerization of acrylic acid ester (acrylic acid ester of ethyl acrylate, butyl acrylate, or 2-ethylhexyl acrylate) and other monomer; an ethylene-propylene rubber obtained by a reaction of ethylene and propylene in a solvent; a butyl rubber obtained by copolymerization of isobutylene and isoprene; a styrene butadiene rubber obtained by copolymerization of butadiene and styrene; an acrylonitrile butadiene rubber obtained by copolymerization of acrylonitrile and butadiene; and a silicone rubber are preferable, from viewpoints of mixing properties or adhesiveness with the radio wave absorption material, impact resistance, durability and weather fastness during a long-term use.

The absorber may include only one kind of binder and may include two or more kinds thereof.

A content of the binder in the absorber is not particularly limited, and is, for example, preferably equal to or greater than 2 mass %, more preferably equal to or greater than 5 mass %, and even more preferably equal to or greater than 10 mass %, with respect to a total solid content of the absorber, from a viewpoint of easily controlling dispersibility of the radio wave absorption material or a bonding power between the radio wave absorption materials.

In addition, the content of the binder in the absorber is not particularly limited, and is, for example, preferably equal to or smaller than 90 mass %, more preferably equal to or smaller than 70 mass %, and even more preferably equal to or smaller than 50 mass %, with respect to a total solid content of the absorber, from a viewpoint of ensuring excellent radio wave absorption performance.

The linear absorber may include components other than the radio wave absorption material and the binder (so-called other components), if necessary.

Examples of the other components that may be included in the linear absorber include a curing agent, a crosslinking agent, a reaction initiator, a plasticizer, and a dispersing agent.

[Support]

The radio wave absorber of the disclosure includes a support.

In the radio wave absorber of the disclosure, the support contributes to retaining of a form of the linear absorber.

The support is not particularly limited, and a well-known support can be used.

Examples of the material configuring the support include a metal plate (plate of metal such as aluminum, zinc, or copper), a plastic sheet [sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which metal described above is laminated or deposited.

In a case where the support is a plastic sheet, for example, as the support, a sheet formed by a well-known film forming method (T tie method or an inflation method) using at least one kind of the materials described above may be used or a commercially available product may be used.

Among these, as the material configuring the support, a metal plate is preferable, and an aluminum plate is more preferable, from viewpoints of durability and retaining of a form of the absorber.

The shape, the structure, or the size of the support can be suitably selected according to the purpose.

The shape of the support is, for example, a flat plate shape.

The structure of the support may be a single-layered structure or a laminated structure of two or more layers.

The size of the support, that is, the size of the support observed in a normal direction can be suitably selected, in accordance with the desired size of the radio wave absorber according to the purpose.

The size of the support is not particularly limited, and is normally approximately 0.01 mm to 10 mm, for example, preferably 0.02 mm to 3 mm and more preferably 0.05 mm to 1 mm, from a viewpoint of handleability.

In a case where the support is, for example, a rigid plate-shaped material such as a metal plate or a resin flat plate, a housing or a radio wave shielding plate as the radio wave absorber having radio wave absorbability can be formed by the support.

In a case where the support is, for example, a plastic sheet having flexibility or a metal-laminated plastic, the radio wave absorber is easily formed in any region, for example, a region having a curved surface.

In a case where the support and the linear absorber described above are disposed adjacent to each other, the support may include a radio wave absorption material.

For example, in a case where the support and the linear absorber are disposed adjacent to each other and the support includes a radio wave absorption material, the radio wave which could not be absorbed by the absorber can be absorbed by the support.

In this case, it is advantageous, from a viewpoint of handleability, because weight reduction of the radio wave absorber can be realized, compared to a case where the absorption layer including the radio wave absorption material is separately disposed on the support not including the radio wave absorption material which will be described later.

[Absorption Layer]

The radio wave absorber of the disclosure may further include an absorption layer that includes a radio wave absorption material and a binder, and absorbs the radio wave, between the support and the linear absorber described above to be adjacent to the linear absorber.

Here, the absorption layer positioned between the support and the linear absorber described above indicates a flat plate-shaped absorption layer having an even thickness.

In a case where the radio wave absorber further includes the absorption layer on the support, the support can be a support not including the radio wave absorption material.

(Radio Wave Absorption Material)

The radio wave absorption material included in the absorption layer is not particularly limited, and the same radio wave absorption material included in the linear absorber described above is used.

The radio wave absorption material included in the absorption layer may be the same as or different from the radio wave absorption material included in the absorber.

A content of the radio wave absorption material in the absorption layer is not particularly limited, and is, for example, preferably equal to or greater than 5 mass %, more preferably equal to or greater than 20 mass %, and even more preferably equal to or greater than 50 mass % with respect to a total solid content of the absorption layer, from a viewpoint of ensuring excellent radio wave absorption properties.

In addition, the content of the radio wave absorption material in the absorption layer is not particularly limited, and is, for example, preferably equal to or smaller than 98 mass %, more preferably equal to or smaller than 95 mass %, and even more preferably equal to or smaller than 92 mass % with respect to a total solid content of the absorption layer, from viewpoints of manufacturing suitability and durability.

(Binder)

The binder included in the absorption layer is not particularly limited, as long as the radio wave absorption material can be dispersed, and an absorption layer having any thickness can be formed in a state where the radio wave absorption material is dispersed in the binder.

As the binder, the same material exemplified as the binder in the linear absorber described above can be used, and the same applies to the preferred example.

The absorption layer may include one kind of the binder or may include two or more kinds thereof.

The binder included in the absorption layer may be the same as or different from the binder included in the linear absorber described above.

A content of the binder in the absorption layer is not particularly limited, and is, for example, preferably equal to or greater than 2 mass %, more preferably equal to or greater than 5 mass %, and even more preferably equal to or greater than 10 mass %, from viewpoints of dispersing the radio wave absorption material in an excellent manner and further increasing a bonding power between the radio wave absorption materials.

In addition, the content of the binder in the absorption layer is not particularly limited, and is, for example, preferably equal to or smaller than 90 mass %, more preferably equal to or smaller than 70 mass %, and even more preferably equal to or smaller than 50 mass %, from a viewpoint of obtaining excellent radio wave absorbability.

A thickness of the absorption layer is not particularly limited, and is, for example, preferably 0.1 mm to 500 mm, more preferably 1 mm to 100 mm, and even more preferably 2 mm to 30 mm, from viewpoints of ease of handling and ensuring installation space.

The absorption layer may include components other than the radio wave absorption material and the binder (so-called other components), if necessary.

Examples of the other components that may be included in the absorption layer include a curing agent, a crosslinking agent, a reaction initiator, a plasticizer, and a dispersing agent.

For example, in a case where a housing surrounding electronic equipment is formed by the radio wave absorber of the disclosure, a housing having excellent strength and durability can be formed by the radio wave absorber by using a support having rigidity.

In this case, by further providing the absorption layer between the support and the linear absorber, a support not having radio wave absorbability can be used as the support having rigidity, a degree of freedom of design, in a case of forming the housing, is improved.

The radio wave absorber of the disclosure is a radio wave absorber hardly receiving an effect of an incidence angle of a radio wave and having excellent radio wave absorbability, and can be suitably used in various electronic equipment. As the radio wave absorber of the disclosure, a linear absorber having a maximum length on a cross section perpendicular to a longitudinal direction of 25% or less of a wavelength of the radio wave. Accordingly, it is advantageous that optimal radio wave absorbability can be simply designed, in accordance with a wavelength of a radio wave of electronic equipment suitable for the intended purpose of the radio wave absorber. Therefore, the radio wave absorber can be applied to various broad electronic equipment and has excellent general-purpose properties. In the evaluation of the radio wave absorbability of the radio wave absorber, it is possible to simply evaluate more accurate radio wave absorbability suitable for the intended purpose of the radio wave absorber, by performing the evaluation by the method described above at a frequency of a radio wave radiated from target electronic equipment.

<Manufacturing Method of Radio Wave Absorber>

The manufacturing method of the radio wave absorber of the disclosure is not particularly limited, as long as the radio wave absorber of the disclosure described above can be manufactured.

As the method of manufacturing the radio wave absorber of the disclosure, a manufacturing method of a radio wave absorber of the disclosure which will be described below is preferable.

The manufacturing method of a radio wave absorber of the disclosure (hereinafter, also referred to as the "manufacturing method of the disclosure") includes a step of linearly ejecting an absorber formation composition including a radio wave absorption material, a binder, and a solvent onto at least one surface of the support from a nozzle (step (A)).

The manufacturing method of the disclosure may include other steps, if necessary.

The other steps, for example, include a step of drying the absorber formation composition ejected in the step (A) (step B), and a step of forming an absorption layer which is any layer (step (C)).

Hereinafter, the step of the manufacturing method of the disclosure will be described in detail.

The specific examples and preferred aspect of the components used in each step are the same as described in the section of the radio wave absorber described above, and therefore, the description here is omitted.

(Step of Ejecting Absorber Formation Composition: Step (A))

The step (A) is a step of linearly ejecting an absorber formation composition including a radio wave absorption material, a binder, and a solvent onto the support from a nozzle.

The absorber formation composition may include other components such as a curing agent, a crosslinking agent, a reaction initiator, a plasticizer, and a dispersing agent, if necessary, in addition to the radio wave absorption material, the binder, and the solvent.

The solvent in the absorber formation composition is not particularly limited, and water, an organic solvent, or a mixed solvent thereof is used.

Examples of the organic solvent include alcohols such as methanol, ethanol, n-propanol, i-propanol, or methoxypropanol, ketones such as acetone, methyl ethyl ketone, or cyclohexane, tetrahydrofuran, acetonitrile, ethyl acetate, and toluene.

Among these, as the solvent, methyl ethyl ketone is preferable, from viewpoints of a comparatively low boiling point and ease of drying.

The absorber formation composition can be prepared, for example, by mixing the radio wave absorption material, the binder, the solvent, and if necessary, other components such as a curing agent, a crosslinking agent, a reaction initiator, a plasticizer, and a dispersing agent.

Each content of the radio wave absorption material and the binder in the absorber formation composition may be adjusted, so that each content of the radio wave absorption material and the binder in the absorber to be finally formed is the content described in the section of the radio wave absorber described above.

A content of the solvent in the absorber formation composition is not particularly limited, and is suitably selected, for example, in accordance with conditions of the kind or amount of the component blended in the absorber formation composition.

In the absorber formation composition, the wave absorption material, the binder, and the solvent may be simply mixed.

The wave absorption material, the binder, and the solvent may be mixed once or may be mixed while separately adding one component to the other component.

A method of mixing the wave absorption material, the binder, and the solvent is not particularly limited, and a method of mixing by stirring is used, for example.

Stirring means are not particularly limited, and a general stirring device can be used.

As the stirring device, a mixer such as a paddle mixer or an impeller mixer is used.

The stirring time is not particularly limited, and for example, can be suitably set in accordance with the kind of the stirring device or the composition of the absorber formation composition.

In the step (A), the absorber formation composition is linearly ejected from the nozzle.

The nozzle used in the ejection is not particularly limited, as long as a nozzle diameter (inner diameter) is 25% or less of a wavelength of a radio wave.

A maximum length of the linear absorber on the cross section can be suitably adjusted, in accordance with a nozzle diameter, a viscosity of the absorber formation composition ejected from the nozzle, and the content of the solvent included in the absorber formation composition.

In order to achieve the occupancy of the linear absorber described above, by measuring a relationship between the measurement of the ejection amount of the absorber formation composition per unit area on the support and the occupancy in advance, it is possible to determine the ejection amount, with which a random occupancy can be achieved, and it is advantageous for the improvement of productivity.

At the time of the ejection, the linear absorber may be ejected onto at least one surface of the support while changing the position of the nozzle, and, for example, ejection nozzles may be disposed in parallel, and the linear absorber may be ejected while changing the position of the support.

In addition, in addition to the method of forming by directly ejecting the linear absorber on the support, for example, a forming method of ejecting the linear absorber onto a temporary support to form a linear absorber having a predetermined occupancy, and transferring the linear absorber onto the support, and peeling the temporary support can also be used.

(Step of Drying Ejected Absorber Formation Composition: Step (B))

The manufacturing method of the radio wave absorber of the disclosure may further include a step of drying the ejected linear absorber (step (B)).

The drying method of the linear absorber in the step (B) is not particularly limited. As the drying method, drying performed by contact heating of heating with a heater from a support side, or drying performed by non-contact heating by blowing warm air or carrying the absorber in a heating zone is used.

The heating condition is a condition is not particularly limited, as long as the solvent in the absorber formation composition is volatilized and the linear absorber has linear self-maintenance.

As an example of the drying method, a method of heating and drying the ejected linear absorber at 40° C. to 250° C. for 1 hour to 48 hours.

(Step of Forming Absorption Layer: Step (C))

The manufacturing method of the radio wave absorber of the disclosure may include a step of forming the absorption layer (step (C)).

In the step (C), the method of forming the absorption layer is not particularly limited.

Examples of the method of forming the absorption layer include a method of applying an absorption layer formation composition including a radio wave absorption material and a binder, and if necessary, further including other components such as a solvent, onto a support, and a method of transferring an absorption layer formed by the absorption layer formation composition including the radio wave absorption material and the binder in advance onto the support.

The formed layer of the absorption layer formation composition is, if necessary, dried to form the absorption layer.

As the drying method, a well-known method of natural drying, heating drying, and pressure reduction drying can be applied alone or in combination of plural methods.

By the manufacturing method of the disclosure, it is possible to simply manufacture the radio wave absorber of the disclosure described above.

EXAMPLES

Hereinafter, the invention will be described in detail with reference to examples, but the invention is not limited to the following examples, within a range not departing the gist thereof.

[Manufacturing of Radio Wave Absorber]

Example 1

The components shown in "composition of absorption layer formation composition" below were stirred and mixed using a stirring device [product name: Awatori Rentaro ARE-310, Thinky Corporation] at a rotation rate of 2000 rotations per minute (rpm; the same applies hereinafter) for 10 minutes, to prepare the absorption layer formation composition.

—Composition of Absorption Layer Formation Composition—
- Barium ferrite [model number: BMXF-5, BGRIMM (Beljing General Research Institute of Mining & Metallurgy), magnetic material]: 100.0 parts by mass
- Acrylonitrile butadiene rubber (NBR) [Grade: JSR N215SL, JSR, binder]: 11.7 parts by mass
- Cyclohexanone (Solvent): 134.1 parts by mass An ethylene propylene diene rubber (EPDM rubber, thickness: 2 mm) is cut to have a length of 75 mm and a width of 10 mm. Next, in a case where the cut EPDM rubber was observed on an aluminum plate (thickness: 0.1 mm) as the support in the normal direction of the support by using a double sided tape, four sheets were attached to the position for forming a square, and a square frame (die frame inner portion on the inner side is 65 mm×65 mm) which is a die for forming the absorption layer was manufactured.

Then, the absorption layer formation composition was poured into the manufactured die, the surface was smoothed by using a stainless steel spatula in a state where the height of the liquid surface of the absorption layer formation composition is the same as the height of the die, and left for a day. After the leaving, the drying was performed using a vacuum oven at a set temperature of 80° C. for 1 hour.

Then, the manufactured die was removed with an EPDM rubber, an absorption layer having a square shape in a case of being observed in the normal direction of the support with a size of 65 mm×65 mm and a thickness of approximately 0.7 mm was formed on the aluminum plate which is the support.

The components shown in "composition of the absorber formation composition" below were stirred and mixed using a stirring device [product name: Awatori Rentaro ARE-310, Thinky Corporation] at a rotation rate of 2000 rpm for 10 minutes, to prepare the absorber formation composition.

—Composition of Absorber Formation Composition—
- Barium ferrite (model number: BMXF-5, BGRIMM, magnetic material): 100.0 parts by mass
- Acrylonitrile butadiene rubber (NBR) [Grade: JSR N215SL, JSR, binder]: 11.7 parts by mass
- Methyl ethyl ketone (Solvent): 34.8 parts by mass A syringe having an inner diameter of the ejection nozzle of 0.5 mm was filled with the prepared absorber formation composition. Next, the filled absorber formation composition was ejected on the absorption layer formed as described above while moving the nozzle randomly in a horizontal direction, and a continuous linear absorber and having an uneven disposition direction was formed on the absorption layer. After the formation, the absorber was left for a day. After the leaving, the drying was performed using a vacuum oven at a set temperature of 80° C. for 1 hour, to obtain a radio wave absorber of Example 1.

An average value of maximum lengths of the formed linear absorbers on a vertical cross section was measured by the method described above, and measured result is shown in Table 1.

Example 2

The same operation as in Example 1 was performed except that, an inner diameter of the ejection nozzle of a syringe used in the formation of the absorber in Example 1 was changed from "0.5 mm" to "0.6 mm", and a radio wave absorber of Example 2 was obtained.

Example 3

The same operation as in Example 1 was performed except that, an inner diameter of the ejection nozzle of a syringe used in the formation of the absorber in Example 1 was changed from "0.5 mm" to "0.9 mm", and a radio wave absorber of Example 3 was obtained.

Example 4

The same operation as in Example 1 was performed except that, a linear absorber was directly formed on an aluminum plate as a support, without forming the absorption layer in Example 1, and an inner diameter of the ejection nozzle of a syringe used in the formation of the absorber in Example 1 was changed from "0.5 mm" to "0.7 mm", and a radio wave absorber of Example 4 was obtained.

Comparative Example 1

The same operation as in Example 1 was performed except that, an inner diameter of the ejection nozzle of a syringe used in the formation of the absorber in Example 1 was changed from "0.5 mm" to "1.3 mm", and a radio wave absorber of Comparative Example 1 was obtained.

Comparative Example 2

The same operation as in Example 1 was performed except that, an inner diameter of the ejection nozzle of a syringe used in the formation of the absorber in Example 1 was changed from "0.5 mm" to "1.4 mm", and a radio wave absorber of Comparative Example 2 was obtained.

Comparative Example 3

The same operation as in Example 1 was performed except that, the absorber was not formed on the absorption layer in Example 1, and a radio wave absorber of Comparative Example 3 was obtained. The radio wave absorber of Comparative Example 3 is a so-called flat plate-shaped radio wave absorber formed of only the absorption layer of Example 1.

[Measurement of Occupancy of Absorber Per Unit Volume]

Regarding the radio wave absorbers in Examples 1 to 3, Comparative Examples 1 and 2, the occupancy (so-called space density) of the linear absorber disposed on the absorption layer per unit volume was measured by the following method.

First, only a portion of the linear absorber on the surface of the radio wave absorber was cut to have a size of 1 cm×1 cm using a microtome, and a plurality of sheets of the occupancy measurement sample of the linear absorber were manufactured.

Water was put into a rectangular parallelepiped-shaped glass cell having an opening size of 1 cm×1 cm to a height of 2 cm, and the mass (unit: g) of water put therein was measured. Then, water in the glass cell was removed, and the glass cell was filled with the occupancy measurement sample of the linear absorber cut to have a size of 1 cm×1 cm to a height of 2 cm. After the filling, water was put into the glass cell to a height of 2 cm, the mass (unit: g) of water put therein was measured. The occupancy of the linear absorber disposed on the absorption layer per unit volume was obtained from measurement values of the mass (g) of water put into the empty glass cell and the mass (g) of water put into the glass cell filled with the occupancy measurement sample of the linear absorber, based on Expression (A). The results are shown in Table 1.

Occupancy of linear absorber per unit volume=1−
 mass (g) of water put into the glass cell filled
 with the radio wave absorber/mass (g) of water
 put into the empty glass cell                    Expression (A)

[Measurement of Return Loss]

A return loss (dB) of the radio wave absorbers of Examples 1 to 3 and Comparative Examples 1 to 3 was measured.

Regarding the return loss (dB) of the radio wave absorber, a return loss (dB) at an incidence angle of 45° and a frequency of 48 GHz was measured using Vector Network Analyzer (product name: MS4647B) manufactured by Anritsu Corporation and horn antenna (product name: RH19R) manufactured by KEYCOM Corp. by a free space method. Measured results are shown in Table 1.

Figure 3:
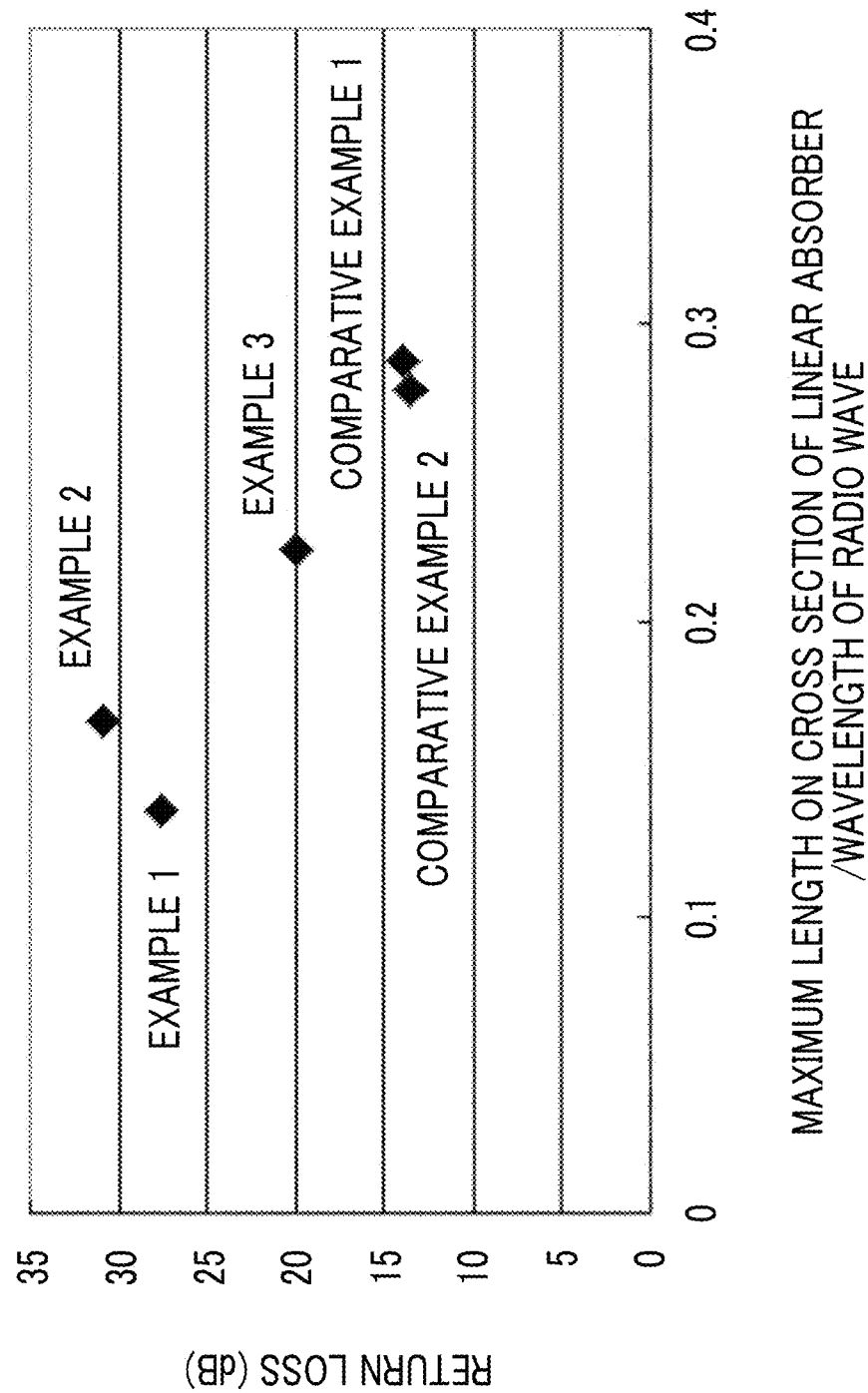
FIG. 3 is a view showing a relationship between a return loss and a maximum length on a cross section using a length direction of the absorber as a normal direction/wavelength of a radio wave at 48 GHz, of radio wave absorbers of examples and comparative examples.

In addition, FIG. 3 shows a relationship between the return loss of the radio wave absorber and maximum length of linear absorber on cross section perpendicular to a longitudinal direction/wavelength of a radio wave at 48 GHz.

A higher numerical value of the return loss means excellent radio wave absorbability and it is preferably equal to or greater than 20.0 dB, from a viewpoint of a function of the radio wave absorber.

As apparent from evaluation results shown in Table 1 and FIG. 3, it is surmised that each radio wave absorber of Examples 1 to 3, including a support, an absorption layer disposed on the support, and a linear absorber that is disposed on the absorption layer, has an occupancy per unit volume on the absorption layer of 0.05 to 0.70, includes a radio wave absorption material and a binder, and has a maximum length on a cross section perpendicular to a longitudinal direction of 25% or less of a wavelength of the radio wave, is a radio wave absorber having a value of the return loss at the incidence angle of 45° and the frequency of 48 GHz of 20.0 dB, hardly receiving an effect of an incidence angle of a radio wave, and having excellent radio wave absorbability.

In addition, from evaluation results of the radio wave absorber of Example 4 shown in Table 1, even in a case where the flat plate-shaped absorption layer is not provided and the linear absorber is directly provided on the support, it is surmised that the radio absorber having a value of the return loss of 20.0 dB, hardly receiving an effect of an incidence angle of a radio wave, and having excellent radio wave absorbability is obtained.

Meanwhile, in the radio wave absorbers of Comparative Examples 1 and 2 that include the linear absorber having a maximum length on a cross section perpendicular to a longitudinal direction exceeding 25% of a wavelength of the radio wave, a lower value of the return loss was shown, compared to that in each radio wave absorber of Examples 1 to 4. In addition, in radio wave absorber of Comparative Example 3 that does not include the linear absorber, a lower value of the return loss was shown, compared to that in each radio wave absorber of Examples 1 to 4.

In Examples, the return loss, that is, the radio wave absorbability at a frequency of 48 GHz is evaluated, but it is needless to say that the wavelength of the radio wave which is the measurement target of the return loss can be suitably selected according to the electronic equipment used.

EXPLANATION OF REFERENCES

1: radio wave absorber
10: support

TABLE 1

| | Shape of absorber | Presence or absence of absorption layer | Maximum length of linear absorber on cross section (mm) | Return loss (dB) [frequency of 48 GHz, incidence angle of 45°] | Maximum length of linear absorber on cross section/ wavelength of radio wave at frequency of 48 GHz (%) | Occupancy of linear absorber per unit volume |
|---|---|---|---|---|---|---|
| Example 1 | Linear shape | Present | 0.88 | 27.7 | 14.1 | 0.21 |
| Example 2 | Linear shape | Present | 0.98 | 31.0 | 15.7 | 0.37 |
| Example 3 | Linear shape | Present | 1.49 | 20.0 | 23.9 | 0.40 |
| Example 4 | Linear shape | Absent | 1.22 | 23.1 | 19.5 | 0.49 |
| Comparative Example 1 | Linear shape | Present | 1.93 | 13.9 | 30.9 | 0.36 |
| Comparative Example 2 | Linear shape | Present | 1.90 | 13.5 | 30.4 | 0.27 |
| Comparative Example 3 | Flat plate shape | Present | — | 13.1 | — | — |

"—" in Table 1 indicates no corresponding values.

20: absorption layer
30: absorber (linear absorber)

The contents of JP2017-065330 filed on Mar. 29, 2017 are incorporated herein by reference.

All of the documents, the patent applications, and the technology standards described here are incorporated here by reference.

What is claimed is:

1. A radio wave absorber comprising:
   a support; and
   a linear absorber having a string shape that is disposed to be overlapped in a direction normal the support on at least one surface of the support, has an occupancy per unit volume on the support of 0.05 to 0.70, includes a radio wave absorption material and a binder in which the radio wave absorption material is dispersed, and has a maximum length on a cross section perpendicular to a longitudinal direction of 25% or less of a wavelength of the radio wave.

2. The radio wave absorber according to claim 1, wherein the support and the linear absorber are disposed adjacent to each other, and the support includes a radio wave absorption material, which is the same as or different from the radio wave absorption material included in the linear absorber.

3. The radio wave absorber according to claim 1, further comprising:
   an absorption layer that is disposed between the support and linear absorber to be adjacent to the linear absorber, and includes a radio wave absorption material and a binder,
   wherein the radio wave absorption material included in the absorption layer is the same as or different from the radio wave absorption material included in the linear absorber, and the binder included in the absorption layer is the same as or different from the binder included in the linear absorber.

4. The radio wave absorber according to claim 1, wherein the radio wave absorption material is a magnetic material.

5. A manufacturing method of the radio wave absorber according to claim 1, the method comprising:
   a step of linearly ejecting an absorber formation composition including the radio wave absorption material, the binder, and a solvent onto the support from a nozzle to form the linear absorber.

6. The radio wave absorber according to claim 1, wherein the support includes a metal plate or a plastic sheet.

* * * * *